United States Patent [19]

Ishida et al.

[11] Patent Number: 5,859,746
[45] Date of Patent: *Jan. 12, 1999

[54] MAGNETIC DISK DRIVE AND FLEXIBLE PRINTED BOARD USED IN SUCH DRIVE

[75] Inventors: Katsuaki Ishida; Mitsuhisa Sekino; Yoshiaki Nagasawa, all of Kawasaki; Tomoo Sukagawa, Higashine; Masaharu Sugimoto, Kawasaki; Tsuyoshi Furukawa, Kawasaki; Masaki Jinbo, Kawasaki; Tsuneyori Ino, Kawasaki; Hisashi Kaneko, Kawasaki; Shinichi Fukuzawa, Kawasaki, all of Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 707,201

[22] Filed: Aug. 30, 1996

Related U.S. Application Data

[62] Division of Ser. No. 342,836, Nov. 21, 1994, Pat. No. 5,583,720.

[30] Foreign Application Priority Data

Feb. 10, 1994 [JP] Japan ................................. 6-016736

[51] Int. Cl.$^6$ .............................. G11B 5/012; G11B 5/48
[52] U.S. Cl. ...................................... 360/97.01; 360/104
[58] Field of Search .................................... 360/104, 105, 360/107, 108, 97.02, 97.03, 97.01, 77.05; 361/749, 727, 764, 761, 760

[56] References Cited

U.S. PATENT DOCUMENTS

| | | |
|---|---|---|
| 4,044,394 | 8/1977 | Hanazono et al. ...................... 360/123 |
| 4,402,025 | 8/1983 | Anderson et al. ............... 360/98.02 X |
| 4,823,217 | 4/1989 | Kato et al. ............................... 360/104 |
| 5,055,969 | 10/1991 | Putnam ..................................... 361/398 |
| 5,074,029 | 12/1991 | Brooks, Jr. et al. ....................... 29/603 |
| 5,095,396 | 3/1992 | Putnam et al. .......................... 360/106 |
| 5,103,359 | 4/1992 | Marazzo .................................. 360/104 |
| 5,375,021 | 12/1994 | Boeckner .............................. 360/97.01 |
| 5,446,609 | 8/1995 | Thanos et al. ........................ 360/97.02 |

FOREIGN PATENT DOCUMENTS

| | | |
|---|---|---|
| 57-143717 | 9/1982 | Japan . |
| 63-53710 | 3/1988 | Japan . |
| 63-55717 | 3/1988 | Japan . |
| 1-78313 | 5/1989 | Japan . |
| 1-292619 | 11/1989 | Japan . |
| 2-64972 | 3/1990 | Japan . |
| 2-177013 | 7/1990 | Japan . |
| 2-177075 | 7/1990 | Japan . |
| 394617 | 9/1991 | Japan . |
| 3-290801 | 12/1991 | Japan . |

Primary Examiner—William J Klimowicz
Attorney, Agent, or Firm—Greer, Burns, & Crain, Ltd.

[57] ABSTRACT

A magnetic disk drive having one or more magnetic disks, one or more read/write heads each recording or reproducing information for a corresponding one of the magnetic disks, a servo head reading control information from a predetermined one of the magnetic disks, and an actuator supporting the one or more read/write heads and the servo head includes first leads extending from the one or more read/write heads along one side of the actuator, and second leads extending from the servo head along the other side of the actuator so that the second leads can be distanced in space from the first leads.

22 Claims, 11 Drawing Sheets

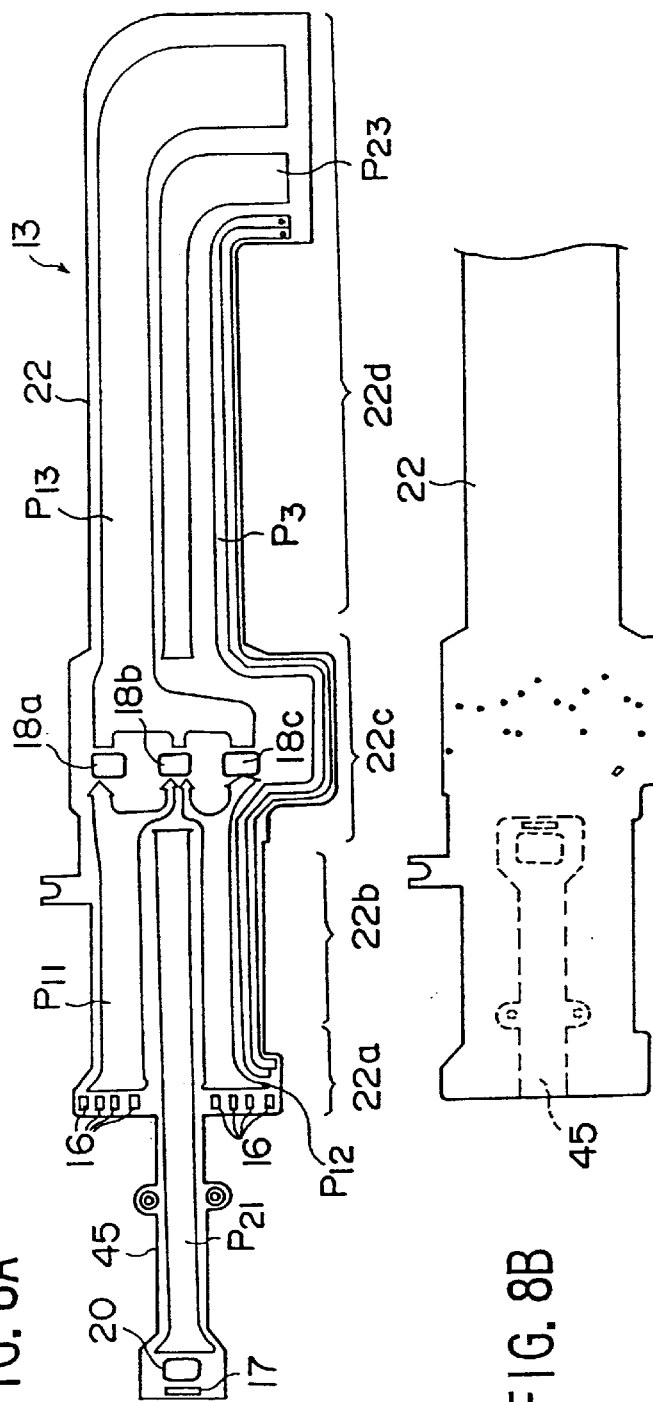
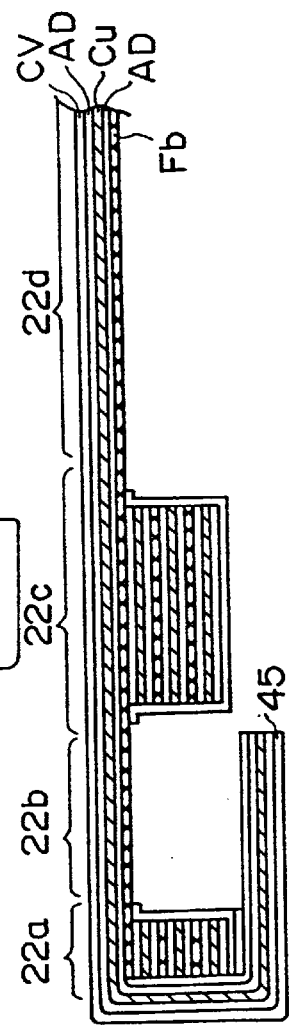
FIG. 8A  FIG. 8B  FIG. 8C

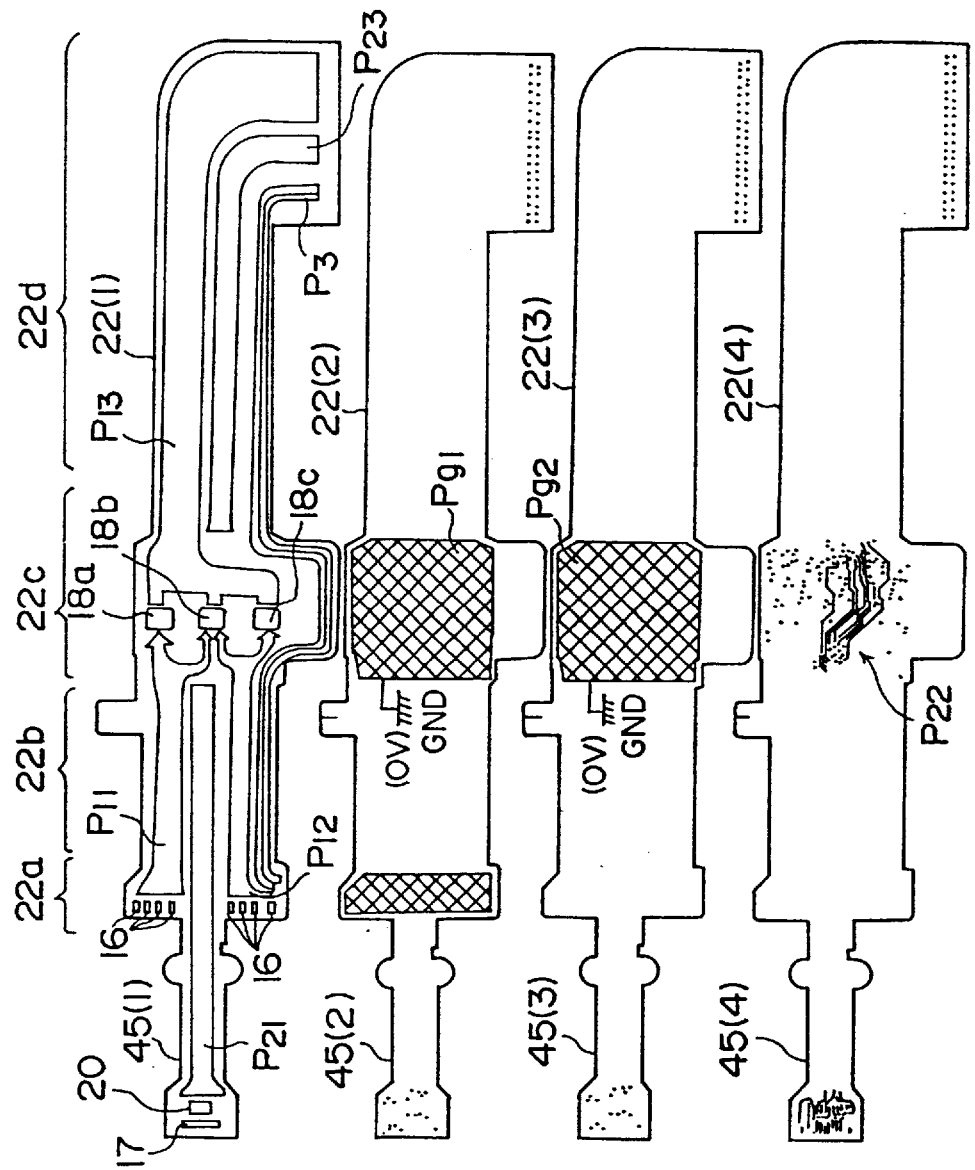

MAGNETIC DISK DRIVE AND FLEXIBLE PRINTED BOARD USED IN SUCH DRIVE

This is a divisional of application(s) Ser. No. 08/342,836 filed on Nov. 21, 1994, now U.S. Pat. No. 5,583,720.

BACKGROUND OF THE INVENTION

1. Field of the Invention

The present invention generally relates to magnetic disk drives and flexible printed boards used in the same, and particularly relates to a magnetic disk drive having a servo head and read/write heads (magnetic heads for recording and reproducing information), and to a flexible printed board connected to the read/write heads and the servo head.

The read/write heads are used for recording and reproducing data for magnetic disks, and the servo head is used for reading from a magnetic disk servo signals which control the positions of the read/write heads.

Keeping pace with a trend of down-sizing and the development of computer systems having a higher processing speed and a larger information storage capacity, magnetic disk drives used as an external storage device are subject to a demand for miniaturization. Also, each component in the magnetic disk drives is required to be implemented with a higher density.

2. Description of the Prior Art

In the magnetic disk drives of the prior art, servo information is read out from a servo surface of a magnetic disk, and the magnetic heads (read/write heads) for recording and reproducing information are positioned on a desired track based on the servo information. Such magnetic disk drives have the read/write heads as well as the servo head on arms thereof. Also, on the actuator thereof are mounted a servo semiconductor devices (servo IC) which are connected with the servo head, and recording and reproducing semiconductor devices (read/write head IC) which are connected with the read/write heads.

When data is read or written, a large amount of electric current tends to flow in the read/write head ICs. This is so, especially when data is written. Thus, if a read/write head IC is provided near a servo IC, an electric current in the read/write head IC can bring about noise in the servo IC, especially when data is written.

The same can be observed if signal lines connecting between a read/write head and a read/write IC for recording and reproducing information is placed in a proximity of servo signal lines connecting a servo IC with a servo head. Namely, an induction noise is generated from the read/write-head signal lines by electromagnetic induction. This induction noise affects the servo signal lines to cause servo noise within servo signals.

If the read/write head IC or the read/write head-signal lines have a harmful effect on the servo heads or the servo signal lines, the positioning of the actuator deteriorates because of disturbance on servo signals.

In the prior art, magnetic disk drives such as the following have been proposed to address the problems as described above.

A first type of such a magnetic disk drive is characterized in that read/write-head signal lines are placed as far as possible from the servo signal lines and also not in parallel to the servo signal lines.

A second type of such a magnetic disk drive is characterized in that a read/write-head and a servo head opposing each other are provided on an actuator at staggered positions, whose displacement is in a direction of the circumference of a magnetic disk or a direction of the revolving movement of the arm.

A third type of such a magnetic disk drive is characterized in that a servo head and a read/write head are not mounted on the same arm.

In the magnetic disk drives of the first and the second types, an arm on which a read/write head and a servo head are mounted inevitably become large. This leads to an enlargement of an actuator.

In the magnetic disk drive of the third embodiment, different arms are provided for the servo head and the read/write head, which leads to an increase in the arm weight. Thus, a larger electric power is required for a voice coil motor driving the actuator. Also, preparing separate arms for servo heads results in an enlargement of the actuator size.

Accordingly, there is a need in the field of magnetic disk drives for a magnetic disk drive which can be miniaturized and in which noise from wirings of read/write heads and read/write-head ICs does not have a harmful effect on wirings of a servo head and servo ICs, and for a flexible printed board used in such a drive.

SUMMARY OF THE INVENTION

Accordingly, it is a general object of the present invention to provide a magnetic disk drive which can satisfy the need described above, and to provide a flexible printed board used in such a drive.

It is another and more specific object of the present invention to provide a magnetic disk drive which can be miniaturized and in which noise from wirings of read/write heads and read/write-head ICs does not have a harmful effect on wirings of a servo head and servo ICs, and for a flexible printed board used in such a drive.

In order to achieve the above objects, according to the present invention, a magnetic disk drive having one or more magnetic disks, one or more read/write heads each recording and reproducing information for a corresponding one of the magnetic disks, a servo head reading servo information from a predetermined one of the magnetic disks in order to control positioning of the read/write heads, and an actuator extending to the one or more magnetic disks and supported by a rod so as to be able to rotate around the rod, which actuator has the read/write heads and the servo head attached on a tip thereof so as to move the read/write heads and the servo head over surfaces of the one or more magnetic disks by rotation around the rod, includes a flexible printed board having a plurality of printed patterns, which flexible printed board has a first board on which first circuit components for the read/write heads are mounted, a second board attached to the first board and on which second circuit components for the servo head are mounted, a first printed pattern formed on the first board and connected to the first circuit components, and a second printed pattern formed on the first board and the second board and connected to the second circuit components, wherein at least part of the second printed pattern within the first board is formed on a different layer from a layer on which the first printed pattern is formed, first leads extending from the read/write heads and connected to the first printed pattern, which first leads as well as the first circuit components are provided on one side of an imaginary plane which is defined by the tip and an axis of the rod, and second leads extending from the servo head and connected to the second printed pattern, which second leads as well as the second circuit components are provided on the other side of the imaginary plane.

Also, a flexible printed board used in the magnetic disk drive according to the present invention includes a plurality of printed patterns, a first board on which first circuit components for the read/write heads are mounted, a second board attached to the first board and on which second circuit components for the servo head are mounted, a first printed pattern formed on the first board and connected to the first circuit components, a second printed pattern formed on the first board and the second board and connected to the second circuit components, wherein at least part of the second printed pattern within the first board is formed on different layers from a layer on which the first printed pattern is formed, first leads extending from the read/write heads and connected to the first printed pattern, which first leads as well as the first circuit components are provided on one side of an imaginary plane which is defined by the tip and an axis of the rod, and second leads extending from the servo head and connected to the second printed pattern, which second leads as well as the second circuit components are provided on the other side of the imaginary plane.

According to the present invention as described above, part of the second printed pattern is formed on a different layer from the layer for the first printed pattern within the first board, so that the space needed for the second printed pattern on the first board can be reduced. Also, the flexible printed board is arranged such that the first circuit components and the first leads extended from the read/write heads to the first printed pattern is placed on one side of the imaginary plane, while the second circuit components and the second leads extending from the servo head to the second printed pattern are placed on the other side of the imaginary plane. Thus, the first circuit components and the first leads can be distanced in space from the second circuit components and the second leads.

Also, according to the present invention, the flexible printed board includes a plurality of printed pattern layers at a portion thereof where the first circuit components are formed, so that the second printed pattern can be formed on a different layer from the layer for the first printed pattern at that portion.

Furthermore, according to the present invention, the flexible printed board includes the second board which has a plurality of printed pattern layers. Thus, a portion where the second circuit components are formed can have a greater rigidity.

Also, according to the present invention, the flexible printed board includes a ground pattern coupled to a ground level and placed between the first printed pattern and the second printed pattern. Thus, the first printed pattern does not have a harmful noise effect on the second printed pattern.

Also, according to the present invention, the flexible printed board includes a single printed pattern layer at a portion which extends between the actuator and a fixing part of the magnetic disk drive, when the flexible printed board is fixed to the actuator and the fixing part. Thus, the rigidity of the flexible printed board can be so small as not to hinder the movement of the actuator.

Also, according to the present invention, the magnetic disk drive includes a back plate attached to a back surface of the flexible printed board at a portion which extends at a sharp angle from the actuator. Thus, the back plate can prevent the flexible printed board from being folded.

Other objects and further features of the present invention will be apparent from the following detailed description when read in conjunction with the accompanying drawings.

BRIEF DESCRIPTION OF THE DRAWINGS

FIGS. 8A to 8C are, respectively, two plan views and a side view of another example of the flexible printed board;

FIGS. 9A to 9D are plan views of four different layers of yet another example of the flexible printed board;

DESCRIPTION OF THE PREFERRED EMBODIMENTS

In the following, embodiments of the present invention will be described.

Figure 1:
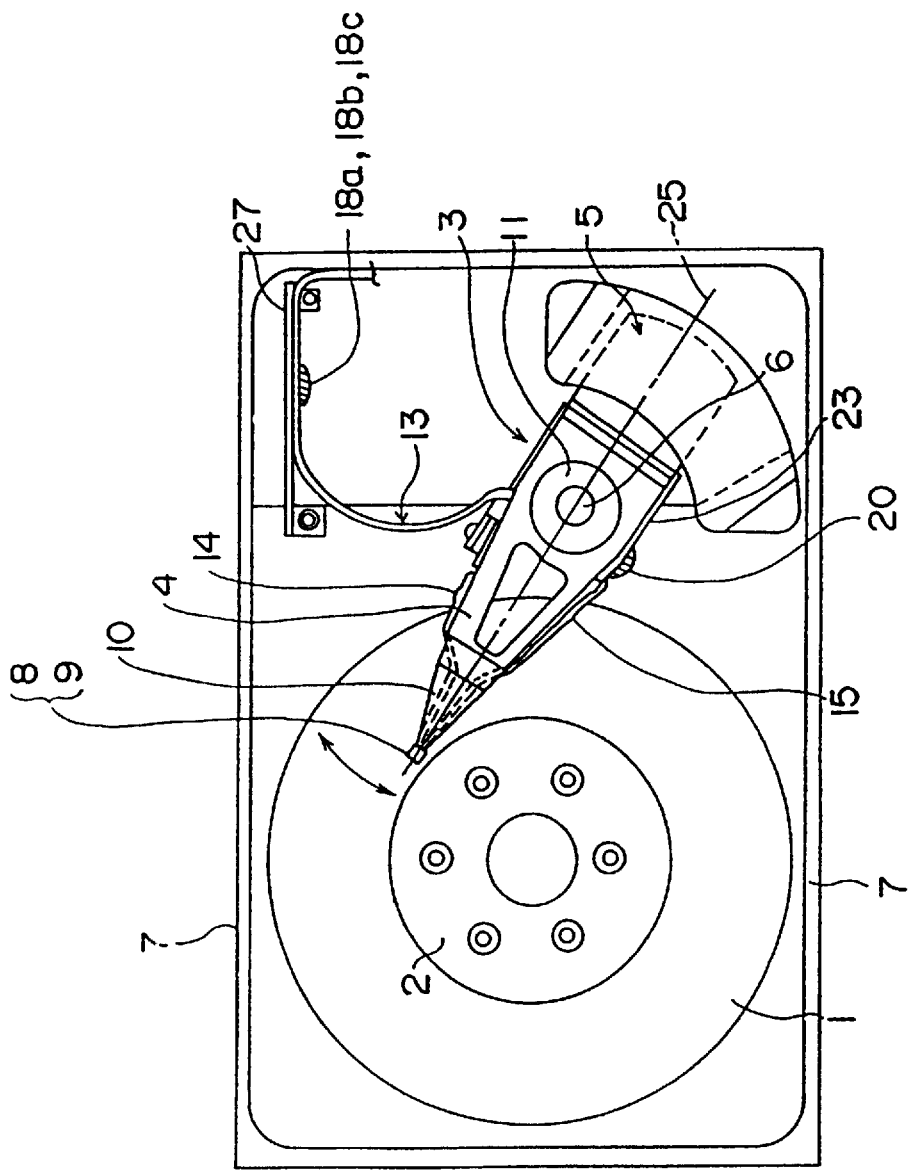
FIG. 1 is a plan view of a magnetic disk drive according to the present invention.

FIG. 1 shows a plan view of an inside of a magnetic disk drive of an embodiment according to the present invention. In FIG. 1, a plurality of magnetic disks 1 are attached one over another to a spindle motor 2, which is fixed on a base 7. The magnetic disks 1 are rotated around their center at a high rotation rate by the spindle motor 2. An actuator 3 is provided near the magnetic disks 1, and includes a plurality of head-arm assemblies 4, a voice coil motor (VCM) 5, and a supporting body 11. Each of the head-arm assemblies 4 has a read/write head 8 at its tip for reading and writing data for a corresponding magnetic disk 1. Here, a predetermined one of the head-arm assemblies 4 has a servo head 9 at the same tip for reading servo information from a servo surface of a corresponding magnetic disk 1. A flexible printed board (called FPC for simplicity hereinafter) 13 is fixed between a bracket 27 and the actuator 3.

Figure 2:
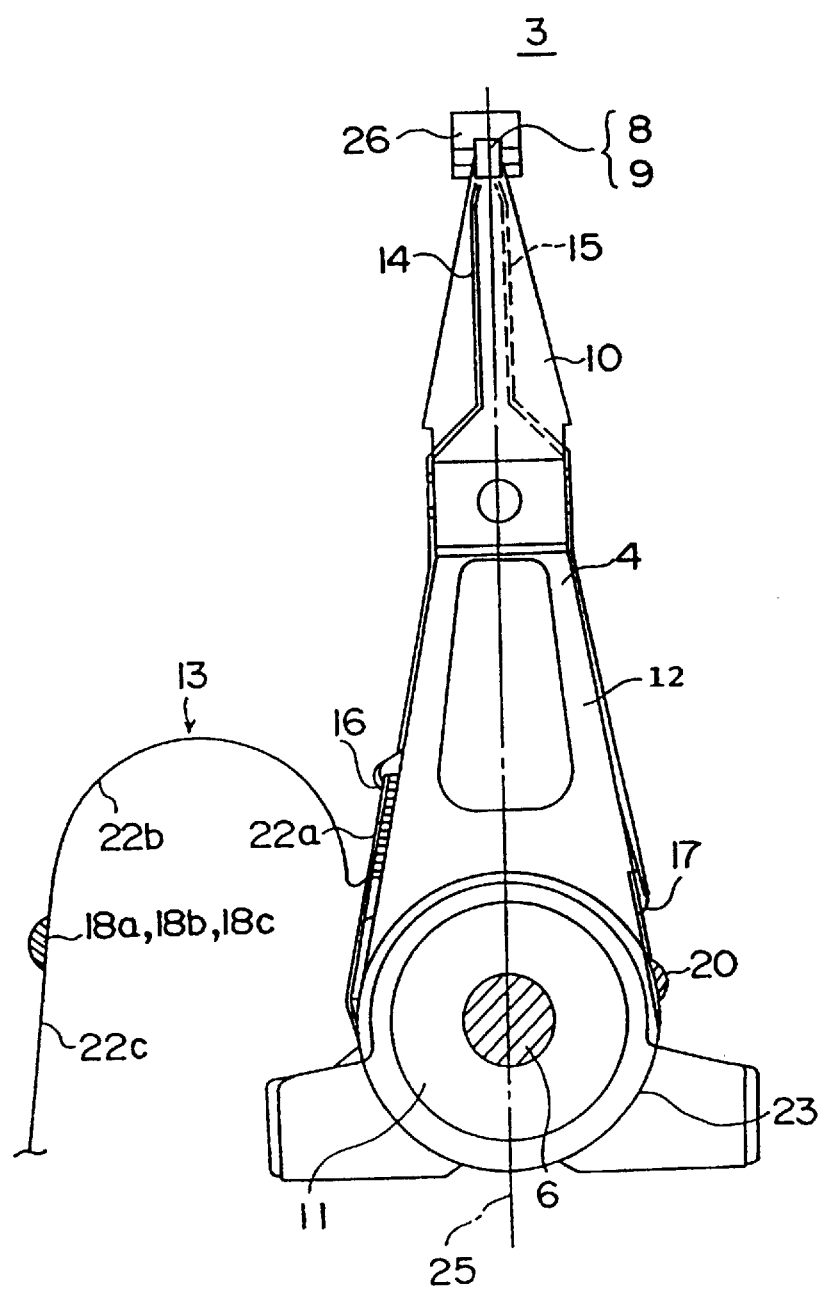
FIG. 2 is a plane view of the actuator and the flexible printed board of FIG. 1, showing a configuration of the flexible printed board mounted on the actuator.
Figure 3:
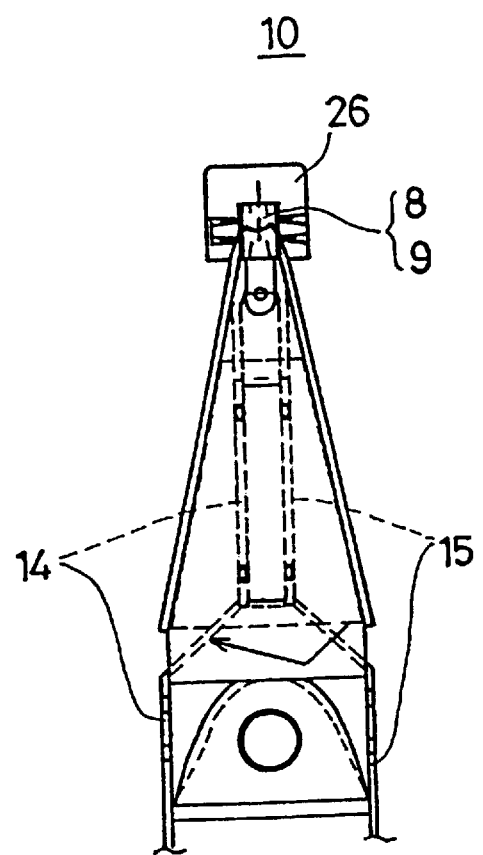
FIG. 3 is an plan view of the spring arm of FIG. 2 which shows the arrangement of read/write-signal lines and servo-signal lines.
Figure 4:
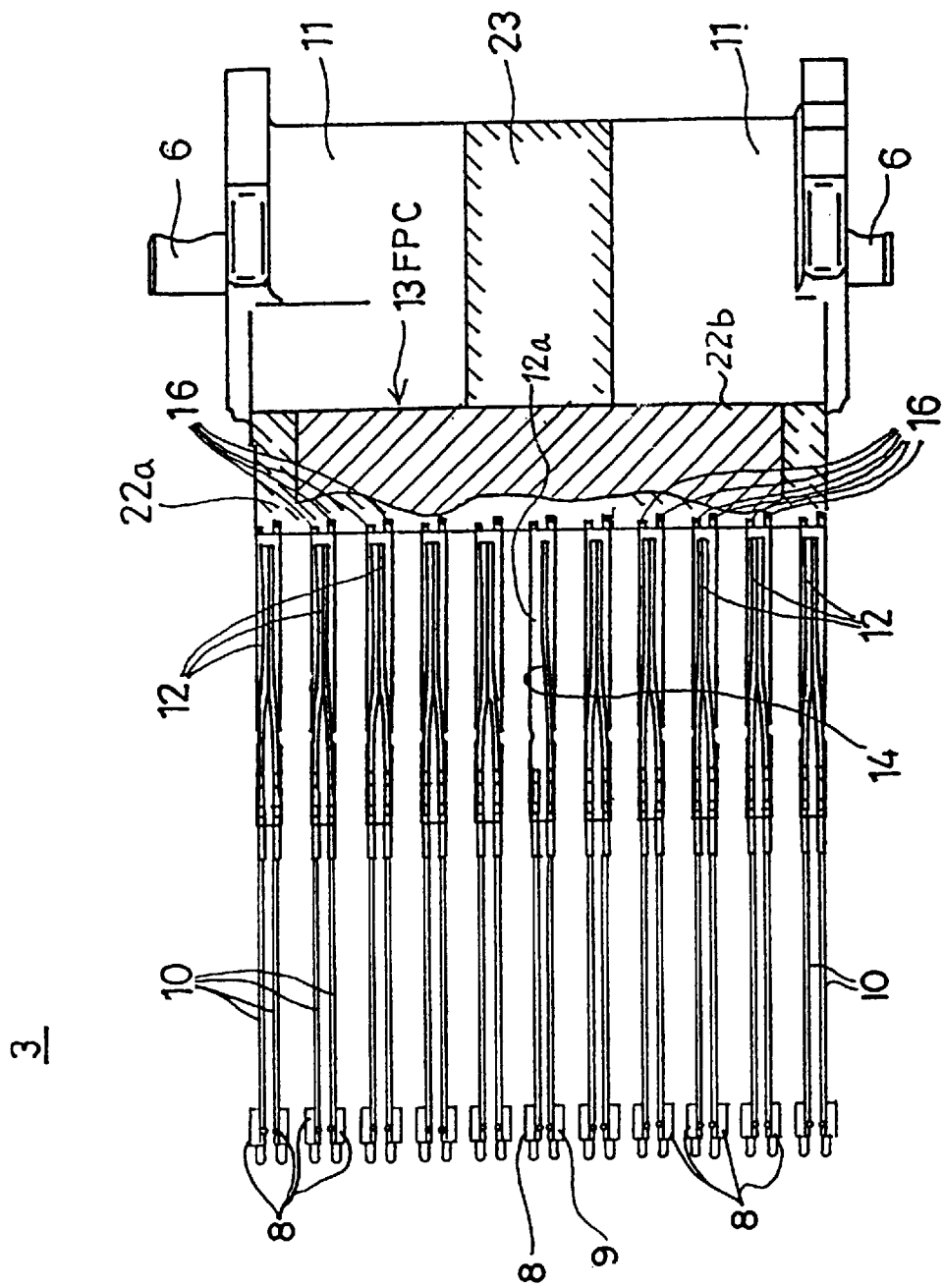
FIG. 4 is a left side view of the actuator of FIG. 2.
Figure 5:
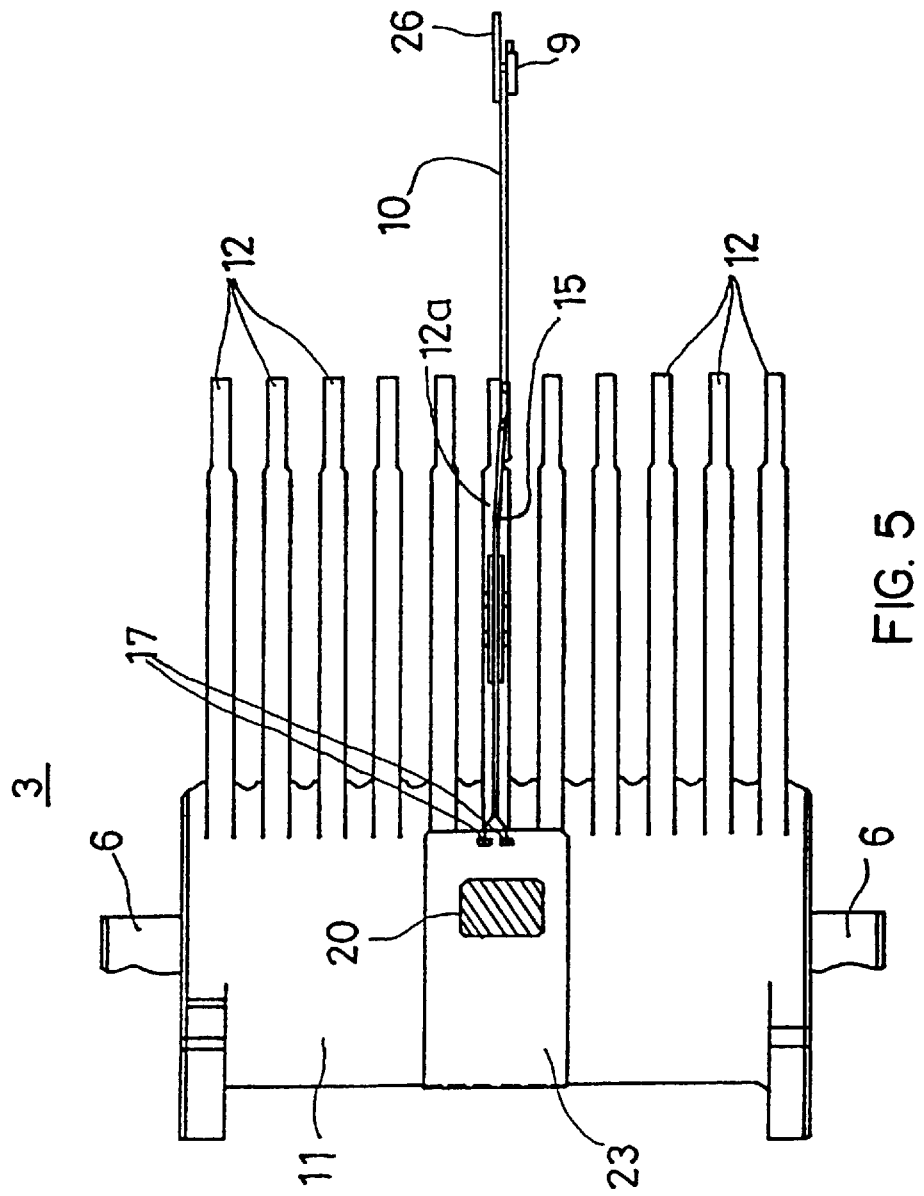
FIG. 5 is a right side view of the actuator of FIG. 2.

The actuator 3 is structured, for example, as shown in FIGS. 2, 3, 4, and 5. FIG. 2 shows a plan view of the actuator 3 (showing the head-arm assemblies 4 provided with the read/write heads 8 and the servo head 9). FIG. 3 is an enlarged plan view of a spring arm, and FIG. 4 is a left side view of the actuator 3. FIG. 5 shows a right side view of the actuator 3.

In those figures, each head-arm assembly 4 includes an arm base 12 projecting from the supporting body 11, and two spring arms 10 connected to the arm base 12. The read/write head 8 is provided at the tips of all the spring arms 10 except one, which has a servo head 9 instead of the read/write head 8 at the tip. The spring arm 10 having the servo head 9 is provided on an arm base 12a arranged at the center of the arrangement of the arm bases 12. The read/write heads 8 and the servo head 9 provided on the head-arm assemblies 4 face surfaces of the magnetic disks 1, and the surface of the magnetic disk 1 which the servo head 9 faces is called a servo surface. The VCM 5 is connected to a side of the supporting body 11 opposite the side having the arm bases 12. The VCM 5 includes VCM magnet, an upper yolk, and a lower yolk. When an electric current is provided for the VCM COIL, the supporting body 11 is revolved around a shaft 6 in a direction shown by an arrow of FIG. 1. The electric current provided for the VCM COIL is controlled by the servo information from the servo head 9, so that the read/write heads 8 are properly positioned on a desired track of the magnetic disks 1. Read/write-signal lines 14 are extended from the read/write head 8, as shown in FIG. 3, on a corresponding spring arm 10, and, as shown in FIG. 2, further extended along a side of a corresponding arm base 12. Also, as shown in FIG. 3, servo-signal lines 15 are extended from the servo head 9 in generally parallel to the read/write-signal lines 14 on the spring arm 10. The servo-signal lines 15 are further extended along the other side of the arm base 12. Namely, the servo-signal lines 15 form a mirror image of the arrangement of the read/write-signal lines 14 by taking an imaginary plane 25 as a mirror plane. The read/write-signal lines 14 from the read/write head 8 and the servo-signal lines 15 from the servo head 9 are soldered to a R/W pad 16 and a servo pad 17, respectively, which are formed on a FPC board 13.

The arm base 12a positioned at the center of the arrangement of the arm bases 12 is provided with two of the spring arms 10. One spring arm 10 is provided with the read/write head 8, and the other is provided with the servo head 9. The two spring arms 10 are arranged in generally parallel as shown in FIG. 4. In order to prevent interference between two electromagnetic fields generated by the read/write head 8 and a servo head 9, the magnetism plate 26 is positioned between the read/write head 8 and the servo head 9. The magnetism plate 26 is fixed to the spring arm 10 of the servo head 9, on the other surface than that provided with the servo head 9, as shown in FIG. 5.

The FPC board 13 is structured, for example, as shown in FIGS. 6A to 6C and FIG. 7.

Figures 6A, 6B, 6C:
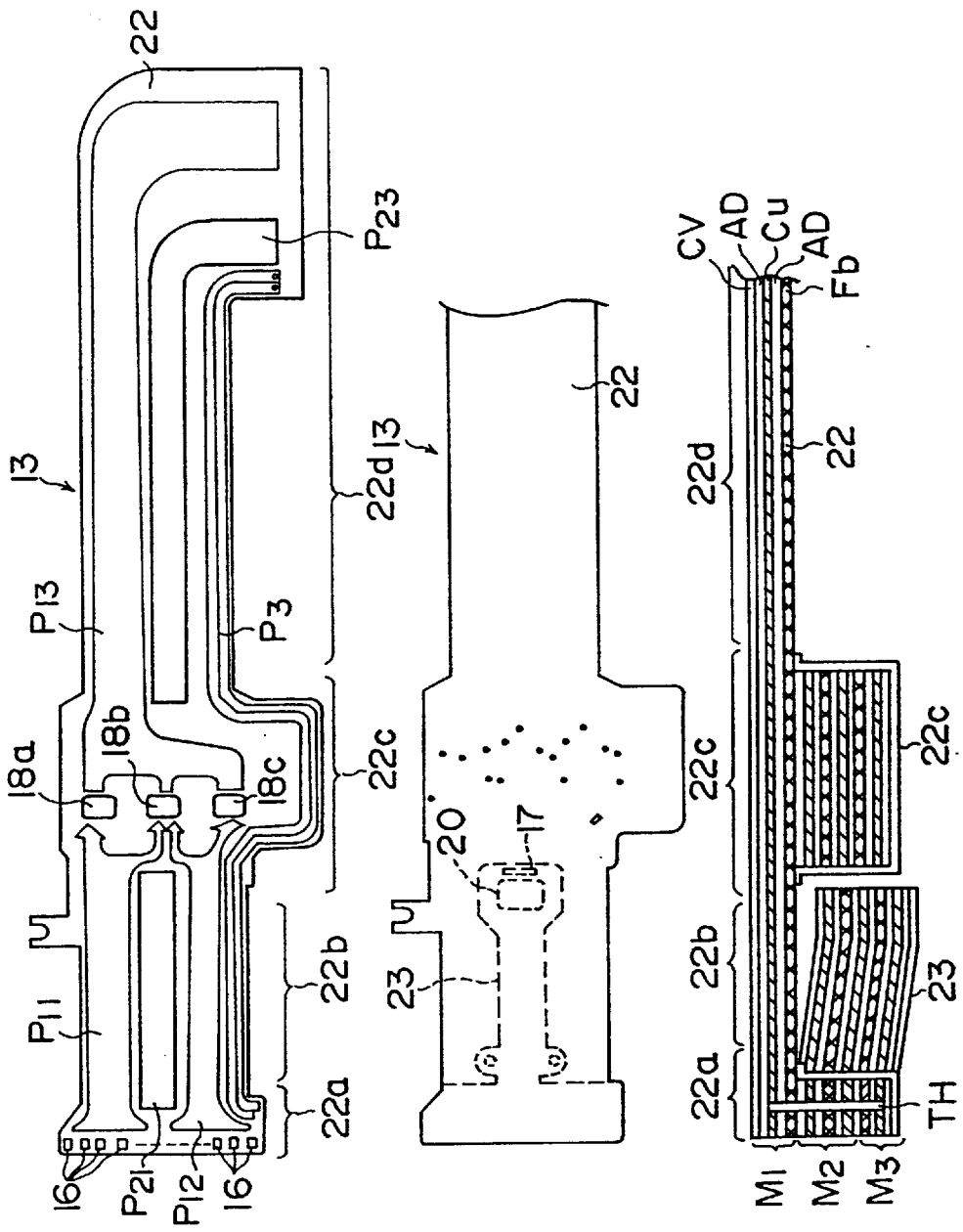
FIGS. 6A to 6C are, respectively, two plan views and a side view of the flexible printed board.

In FIGS. 6A through 6C, the FPC board 13 includes a first FPC board 22 and a second FPC board 23. The first FPC board 22 includes a movable part 22a which is fixed to and moves along with the side of the actuator 3, and a fixed part 22c which is fixed to the bracket 27 provided on the base 7 of the magnetic disk drive. The first FPC board 22 also includes a bending part 22b provided between the actuator 3 and the bracket 27, and an extended part 22d extending from the fixed part 22c to connectors. The second FPC board 23 is glued at its one end with the back surface of the movable part 22a of the first FPC board, and faces the back surface of the bending part 22b. The first FPC board 22 includes a base film Fb of a polyimide resin and a one sided board M1 which has a patterned layer Cu made of copper connected to the base film Fb with a adhesive layer AD. Also, a two sided board M2 which has two patterned layers Cu adhered on the two surfaces of a base film Fb is provided on the back surface of the fixed part 22c of the first FPC board 22. Furthermore, a one sided board M3 which has a patterned layer Cu adhered on one surface of a base film Fb is provided on the two sided board M2 so as to form a layered body all together. Thus, the fixed part 22c of the first FPC board 22 has a four-layered structure. The second FPC board 23 has a three-layered structure formed with the two sided board M2 and the one sided board M3. The second FPC board 23 is adhered at its one end on the back surface of the movable part 22a of the first FPC board 22, and, thus, the movable part 22a also ends up having a four-layered structure. A through hole TH is formed through the movable part 22a of the first FPC board 22, in order to make wiring between each layer possible.

In the first FPC board 22, such circuit components as read/write driver elements (read/write ICs) 18a, 18b, and 18c, capacitors, resistors, etc. for forming a driver circuit of the read/write head 8 are provided at predetermined locations on the fixed part 22c. The read/write ICs 18a, 18b, and 18c are implemented on the first FPC board 22 by a method called chip-on-board (COB). That is, each of the read/write ICs is implemented on the first FPC board 22 by first bonding the semiconductor chips on the board, then connecting the semiconductor chip with the land of the board by wire-bonding, and finally covering the semiconductor chips with a potting resin. Semiconductor chips implemented on a board by such a method are called a bare chip. Forming each of the read/write ICs as bare chips can make the effective area occupied by the ICs small, thus realizing the miniaturization of the FPC board.

Since the fixed part 22c of the first FPC board 22 has a four-layered structure as described above, the fixed part 22c has a higher rigidity than a one-layered FPC board. Thus, the chip-on-board method can be readily used for mounting the read/write ICs directly on the FPC board. Here, the four-layered structure is provided as an integral multi-layered structure. That is, the four-layered structure is a unitary structure in which layers are adhered with each other, as described above, rather than being merely mounted one over the other.

Servo driving elements (servo ICs) are implemented on the second FPC board 23 at the free end thereof and at a location near the servo pad 17, by the same chip-on-board method as used for the read/write ICs 18a, 18b, and 18c. Since the second FPC board 23 has a three-layered structure, its rigidity is higher than that of a one-layered structure. Thus, the servo ICs can be readily mounted by the chip-on-board method.

Figure 7:
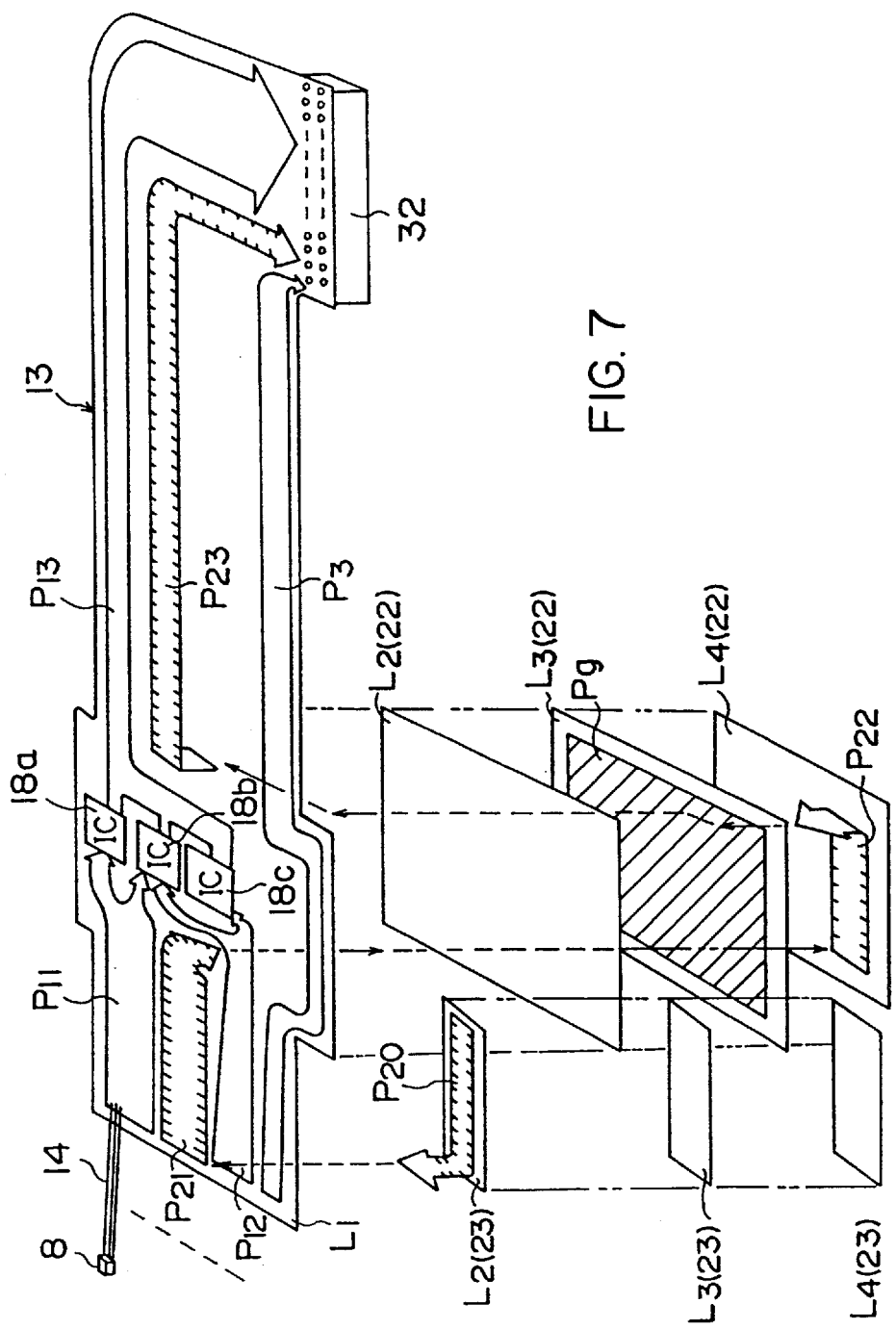
FIG. 7 is an expanded view of the flexible printed board showing printed patterns formed across layers.

As shown in FIG. 6A and FIG. 7, a wiring pattern is formed on the patterned layer Cu (the first layer L1) of the first FPC board 22. This pattern includes read/write patterns P11, P12, and P13 for conducting signals for the read/write head 8, servo patterns P21 and P23 for conducting signals for the servo head 9, and a power-line pattern P3 for the VCM 5. The read/write patterns P11 and P12 are extended from the read/write pad 16 to the read/write ICs 18a, 18b, and 18c on the fixed part 22c via the bending part 22b. The read/write pattern P13 is extended from the read/write ICs 18a, 18b, and 18c through the extended part 22d to the end thereof. The servo pattern P21 is extended from the movable part 22a to an end of the fixed part 22c on the side of the bending part 22b. The servo pattern P23 is extended from an end of the fixed part 22c on the side of the extended part 22d to the end of the extended part 22d. Also, the power-line pattern P3 for the VCM 5 is extended from the movable part 22a to the end of the extended part 22d through the bending part 22b, the fixed part 22c, and the extended part 22b.

In the other patterned layers Cu of the FPC board 13, wiring patterns shown in FIG. 7 are formed.

The top patterned layer (L2(23)) of the second FPC board 23, which corresponds to the second layer of the FPC board 13, has a servo pattern P20 formed thereon which is connected to the servo IC 20. The servo pattern P20 is also connected to a servo pattern P21, formed on the first layer L1 of the FPC board 13, through the through hole TH. Patterned layers (L3(23) and L4(23)), which correspond to the third and fourth layers of the FPC board 13, respectively, have predetermined patterns formed thereon. In the fixed part 22c of the first FPC board 22, a second layer L2(22) has a predetermined circuit pattern formed thereon, and a third layer L3(22) has a ground pattern Pg connected to a ground level. Furthermore, a fourth layer L4(22) has a servo pattern P22 formed thereon having one end connected to the servo pattern P21, which is extended from the movable part 22a to the fixed part 22c on the first layer L1. The other end of the servo pattern P22 on the fourth layer L4(22) is connected to the servo pattern P23, which is extended from the fixed part 22c to the extended part 22d on the first layer L1. Thus, the servo patterns P20, P21, P22, and P23 are connected in a series from the movable part 22a, which is provided with the R/W pad 16, to the end of the extended part 22d connected to a connector 32. Layers through which the servo patterns P20, P21, P22, and P23 are connected in a series include the first layer L1, the second layer L2(23), and the fourth layer L4(22).

As described above, the four-layered structure of the fixed part 22c of the first FPC board 22 provides an arrangement in which the ground pattern Pg is formed between the servo pattern P22 and the read/write ICs 18a to 18c and part of the read/write patterns P11 to P13. Thus, the effect of noise from the wirings of the read/write head 8 on the servo pattern P22 can be reduced. Also, since the bending part 22b of the first FPC board 22 is formed as a single layer of a printed-pattern, the bending part 22b does not have enough rigidity to hamper the movement of the actuator 3.

The FPC board 13 described above is provided in the magnetic disk drive, as shown in FIG. 1, FIG. 2, FIG. 4, and FIG. 5. The positioning of the FPC board 13 in the magnetic disk drive will be described below with reference to those figures.

The movable part 22a of the first FPC board 22 is fixed on a side of the head-arm assemblies 4, and the fixed part 22c is fixed on the bracket 27. The bending part 22b is loose between the head-arm assemblies 4 and the bracket 27. The extended part 22d of the first FPC board 22 is extended from the bracket 27 further to the connector. As shown in FIG. 4 and FIG. 5, the second FPC board 23 is extended from the connecting point of the movable part 22a, and is placed on the side surface of the supporting body 11 by directing away from the head-arm assemblies 4. Then, the second FPC board 23 is looped around the supporting body 11, so that the tip of the second FPC board 23 is positioned opposite the movable part 22a around the supporting body 11. The tip of the second FPC board 23 is provided with the servo IC 20. The read/write-signal lines 14 extending along one side of the arm bases 12 are coupled to the R/W pad 16 formed on the movable part 22a of the first FPC board 22. The servo signal lines 15 extending along the other side of the arm base 12a are coupled to the servo pad 17. Namely, the read/write head ICs 18a, 18b, and 18c are placed on one side of the imaginary plane 25, and the servo IC is placed on the other side.

As described above, in the magnetic disk drive provided with the FPC board 22, wirings for the servo head 9 is distanced in space from wirings for the read/write head 8. Thus, an effect of noise from the wiring for the read/write head 8 on the wiring for the servo head 9 can be reduced.

The FPC board 22 may be formed as shown in FIGS. 8A to 8C. In this example, the second FPC board is formed as an extension of the first FPC board.

In FIGS. 8A to 8C, the first FPC board 22 includes the movable part 22a, the bending part 22b, the fixed part 22c, and the extended part 22d, as same as before. The movable part 22a and the fixed part 22c have a four-layered structure, and the bending part 22b and the extended part 22d have a single-layer structure. The first layer of the movable part 22a is extended to form a second FPC board 45. Thus, the second FPC board 45 is has a single-layer structure. On the tip of the second FPC board 45 formed a servo pad. Also, the servo IC 20 is provided on the same tip, and connected to the servo pad. The servo pattern 21 connected to the servo IC 20 is formed on the first and second FPC boards 22 and 45, and reaches the fixed part 22c of the first FPC board 22. In the same manner as in FIG. 7, the servo pattern P21 is connected to a servo pattern formed on the fourth layer, which is in turn connected to the servo pattern P23 on the first layer.

As shown in FIGS. 8B and 8C, the second FPC board 45 is folded to the back surface of the first FPC board 22 so as to form the same structure as that of FIG. 6. In this positioning, the FPC board 13 is mounted in the magnetic disk drive as shown in FIG. 1, FIG. 2, FIG. 4, and FIG. 5.

By the use of the FPC board as shown in FIG. 8, the read/write ICs 18a, 18b, and 18c can be implemented on the same patterned layer as the servo IC, so that each IC can be implemented in a single process (COB bonding process).

The FPC board 22 may be formed as shown in FIG. 9. In this example, the first and second FPC boards are all structured in four layers, and, at the same time, the second FPC board is formed as an extension of the first FPC board.

In FIG. 9, the first FPC board includes four layers 22(1), 22(2), 22(3), and 22(4), and the second FPC board includes another four layers 45(1), 45(2), 45(3), and 45(4) formed by corresponding layers of the first FPC board extending further out. The first layers of the first and second FPC boards are formed in the same structure as in FIG. 8A. Also, the second and third layers 22(2) and 22(3) of the first FPC board have ground patterns formed thereon in the position of the fixed part 22c. On the fourth layer 22(4), the servo pattern P22 is formed at the location of the fixed part 22c, and is connected to the servo patterns P21 and P23 on the first layer.

This FPC board 13 is mounted in the magnetic disk drive in the same manner as that of FIG. 8.

Figure 10:
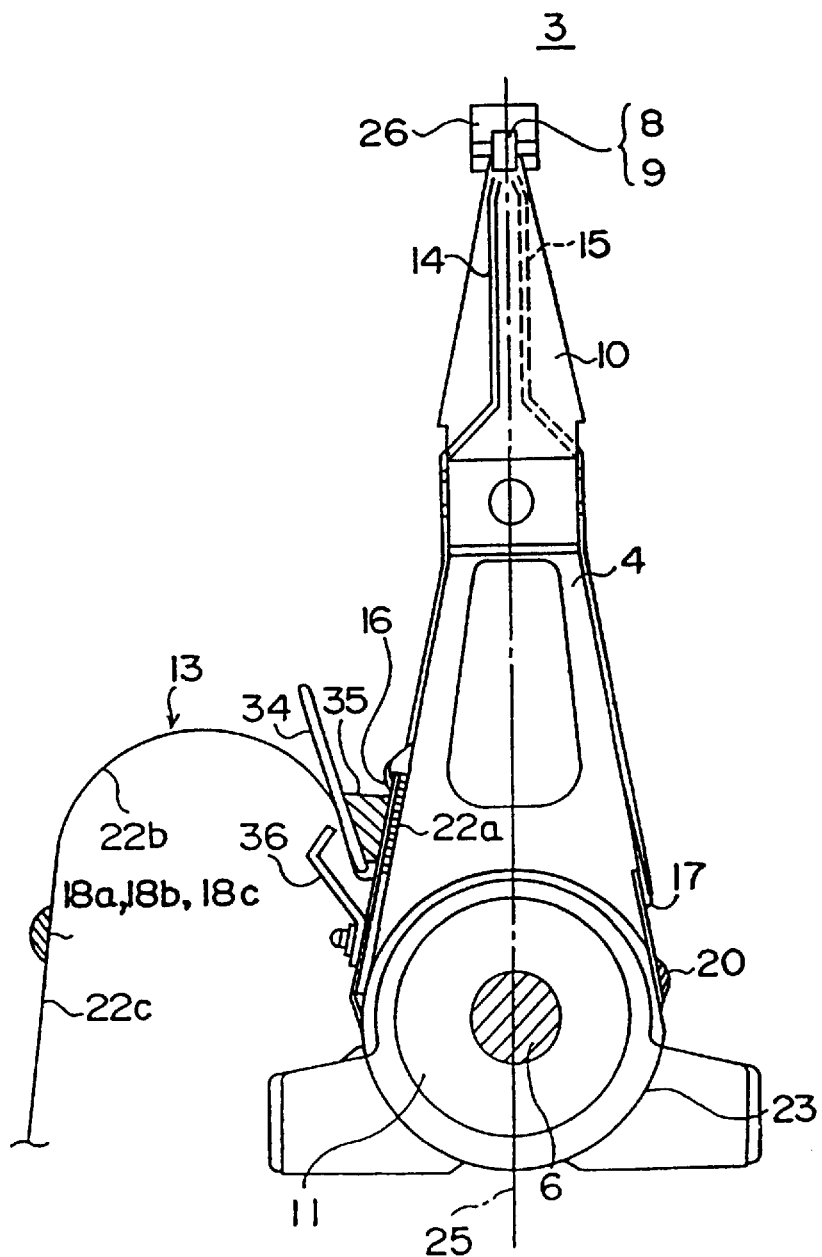
FIG. 10 is a plane view of another configuration of the flexible printed board mounted on the actuator.

The FPC board 13 can be attached to the actuator 3, for example, as shown in FIG. 10.

In FIG. 10, the movable part 22a of the FPC board 22 is fixed to the actuator 3. The bending part 22b is extended at a sharp angle relative to the movable part 22a, and is loose between the actuator 3 and the bracket 27, where the fixed part 22c is attached. In this positioning, it is possible that the bending part 22b is folded toward the head-arm assemblies 4. In order to prevent this, a back plate 34 is glued to the back surface of the bending part 22b at a portion extending at a sharp angle, and a FPC guide 35 for filling the space between the bending part 22b and the movable part 22a is fixed on the back plate 34. Also, an urging spring 36 is mounted on the actuator 3 with a screw so as to urge the bending part 22b at the portion the back plate 34 glued on.

In this configuration of the FPC board, a force applied on the bending part 22b of the FPC board 22 toward to head-arm assemblies 4 cannot fold the bending part 22b because the bending part 22b is supported by the back plate 34. Also, since the back plate 34 is fixed on the back surface of the bending part 22b in advance, there is no need to attach the back plate 34 after the read/write-signal lines 14 are soldered on the R/W pad 16 of the movable part 22a. Thus, the number of steps for mounting the FPC board 13 can be reduced, and the R/W pad 16 can be prevented from a possible damage caused by the attaching of the back plate 34. Also, the positioning of the back plate 34 can be made precisely.

The read/write ICs 18a, 18b, and 18c and the servo IC 20 can be bonded to the FPC board 13 by forming solder bumps on electrode pads and utilizing the reflow of the solder (the flip-chip method). Semiconductor chips bonded on the board in such a manner are called flip chips. Implementing semiconductor devices on a FPC board by the flip chip method makes it possible to use the semiconductor devices further miniaturized and made thinner.

Figure 11:
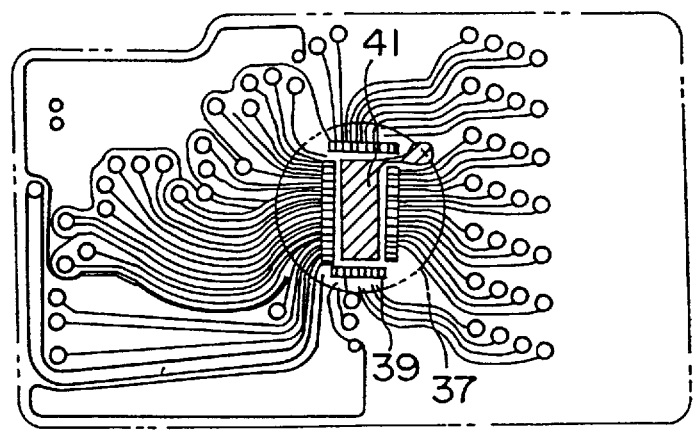
FIG. 11 is an illustrative drawing showing an example of printed pattern on the flexible printed board for implementing read/write ICs.
Figure 12:
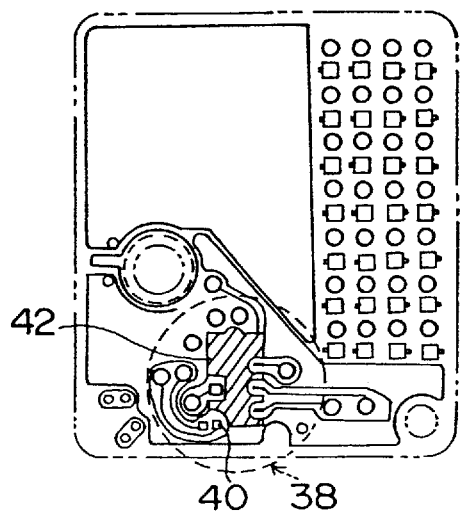
FIG. 12 is an illustrative drawing showing an example of printed pattern on the flexible printed board for implementing a servo IC.

FIG. 11 and FIG. 12 show printed patterns on which semiconductor devices (the read/write ICs 18a, 18b, and 18c and the servo IC 20) are implemented by using the flip chip method. FIG. 11 shows a printed pattern to implement the read/write IC. In FIG. 11, land 39 for the read/write IC is formed on the data-head implementing part 37, and the read/write IC is implemented on the land 39 by the flip chip method. Also, a ground pattern 41 is formed on the data-head implementing part 37 so as to face the circuit of the read/write IC. FIG. 12 shows a pattern to implement the servo IC. Land 40 for the servo IC is formed on the servo-IC implementing part 38, and the servo IC is implemented on the land 40 by using the flip chip method. Also, similarly to the ground pattern 41, a ground pattern 42 is formed on the data-head implementing part 38 so as to face the circuit of the servo IC.

The ground patterns as described above, which are formed on the FPC board so as to face the circuit of the semiconductor devices formed on the FPC board, can reduce noise interference on the semiconductor devices (the read/write IC and the servo IC).

The layer of the FPC board 13 on which the semiconductor devices (the read/write IC and the servo IC) are implemented may be made thinner than other layers. By doing so, printed patterns to be connected to the semiconductor devices can be made in finer patterns, which leads to an increase in the implementation density of circuit components. In order for this to be realized, for example, printed-pattern layers (Cu) to implement semiconductor devices can be made at a half the thickness of the other printed-pattern layer (Cu: 35 $\mu$m), i.e. at the thickness of 17.5 $\mu$m.

According to the present invention as described above, part of the servo pattern is formed on a different layer from the layer for the read/write patterns within the first FPC board, so that the space needed for the servo pattern on the first FPC board can be reduced. This leads to the miniaturization of the first FPC board. Also, the FPC board is arranged such that the read/write ICs and the read/write-signal lines extending from the read/write head to the read/write pattern are placed on one side of the imaginary plane, while the servo IC and the servo-signal lines extended from the servo head to the servo pattern are placed on the other side of the imaginary plane. Thus, the read/write ICs and the read/write-signal lines can be distanced in space from the servo IC and the servo-signal lines. As a result, noise interference can be reduced between wirings for the read/write head and wirings for the servo head.

Further, the present invention is not limited to these embodiments, but various variations and modifications may be made without departing from the scope of the present invention.

What is claimed is:

1. A magnetic disk drive comprising:
   one or more magnetic disks;
   one or more read/write heads each recording or reproducing information for a corresponding one of said magnetic disks;
   a servo head reading control information from a predetermined one of said magnetic disks in order to control positioning of said one or more read/write heads;
   an actuator supporting said one or more read/write heads and said servo head; and
   a flexible printed board having a first layer and a second layer generally defining flat surfaces that face each other, said second layer being positioned under said first layer, wherein first circuit components for said one or more read/write heads, second circuit components for said servo head, a first printed pattern connected to said first circuit components, and a first part of a second printed pattern connected to said second circuit components are formed in and supported by said first layer, while a second part of said second printed pattern is formed in and supported by said second layer so that said first circuit components are bypassed by said second part of said second printed pattern, said second part of said second printed pattern extending underneath said first circuit components in said second layer, said second part of said second printed pattern bypassing said first components in a separate plane from a plane generally defined by said first components, wherein horizontal space required for said second printed pattern on said first layer is reduced.

2. The magnetic disk drive as claimed in claim 1, further comprising:
   a rod supporting said actuator so as to allow said actuator to rotate therearound wherein said actuator has said one or more read/write heads and said servo head attached on a tip thereof so as to move said one or more read/write heads and said servo head over surfaces of said one or more magnetic disks by rotation around said rod;
   first leads extending from said one or more read/write heads and connected to said first printed pattern, said first leads as well as said first circuit components are provided on one side of an imaginary plane which is defined by said tip and an axis of said rod; and
   second leads extending from said servo head and connected to said second printed pattern, said second leads as well as said second circuit components are provided on an other side of said imaginary plane, and wherein
   said flexible printed board having a plurality of printed patterns, which flexible printed board having a first board carrying said first circuit components mounted thereon and a second board attached to said first board and carrying said second circuit components mounted thereon, said first printed pattern being formed on said first board, said second printed pattern being formed on said first board and said second board, wherein at least part of said second printed pattern within said first board is formed on a different layer from a layer on which said first printed pattern is formed.

3. The magnetic disk drive as claimed in claim 1, wherein said first board further comprises a plurality of printed-pattern layers at a portion where said first circuit components are mounted.

4. The magnetic disk drive as claimed in claim 1, wherein said second board further comprises a plurality of printed-pattern layers.

5. The magnetic disk drive as claimed in claim 1, wherein said first board further comprises a ground pattern connected to a ground level and formed on a printed-pattern layer placed between said first printed pattern and said second printed pattern.

6. The magnetic disk drive as claimed in claim 1, wherein said first board further comprises one end attached to said actuator, an extending portion next to said one end and extending away from said actuator, a fixed portion next to said extending portion and fixed to a fixing part of a base of said magnetic disk drive, and the other end extending from said fixing part.

7. The magnetic disk drive as claimed in claim 6, wherein said fixed portion is provided with said first circuit components.

8. The magnetic disk drive as claimed in claim 6, wherein said extending portion comprises a single printed-pattern layer.

9. The magnetic disk drive as claimed in claim 6, further comprising a back plate preventing said extending portion from being folded on said one end, wherein said extending portion extends from said actuator at a sharp angle.

10. The magnetic disk drive as claimed in claim 1, wherein at least either said first circuit components or said second circuit components comprise bare chips.

11. The magnetic disk drive as claimed in claim 1, wherein at least either said first circuit components or said second circuit components comprise flip chips.

12. The magnetic disk drive as claimed in claim 11, wherein a patterned layer on which said flip chips are formed comprises ground patterns formed thereon, which face circuits of said flip chips.

13. The magnetic disk drive as claimed in claim 1, wherein said second layer is only provided around a portion of said flexible printed board where said first circuit components are formed.

14. The magnetic disk drive as claimed in claim 13, wherein said flexible printed board further comprises a ground pattern connected to a ground level and formed on a middle layer between said first layer and said second layer.

15. The magnetic disk drive as claimed in claim 1, wherein said flexible printed board further comprises a first board for said first printed pattern and said second printed pattern and a second board for said second printed pattern, said first board having one end attached to said actuator, an extending portion next to said one end and extending away from said actuator, and a fixed portion next to said extending portion and fixed to a fixing part of a base of said magnetic disk drive, said second board attached to said first board and extending from said one end along said actuator.

16. The magnetic disk drive as claimed in claim 15, wherein said fixed portion is provided with said first circuit components.

17. The magnetic disk drive as claimed in claim 15, wherein said extending portion comprises a single printed-pattern layer.

18. The magnetic disk drive as claimed in claim 15, further comprising a back plate preventing said extending portion from being folded on said one end, wherein said extending portion extends from said actuator at a sharp angle.

19. The magnetic disk drive as claimed in claim 1, wherein at least either said first circuit components or said second circuit components comprise bare chips.

20. The magnetic disk drive as claimed in claim 1, wherein at least either said first circuit components or said second circuit components comprise flip chips.

21. The magnetic disk drive as claimed in claim 20, wherein a patterned layer on which said flip chips are formed comprises ground patterns formed thereon, which face circuits of said flip chips.

22. A magnetic disk drive comprising:

one or more magnetic disks;

one or more read/write heads each recording or reproducing information for a corresponding one of said magnetic disks;

a servo head reading control information from a predetermined one of said magnetic disks in order to control positioning of said one or more read/write heads;

an actuator supporting said one or more read/write heads and said servo head; and a flexible printed board having a first layer and a second layer generally defining flat surfaces that face each other, said second layer being positioned under said first layer, wherein first circuit components for said one or more read/write heads, second circuit components for said servo head, a first printed pattern connected to said first circuit components, and a first part of a second printed pattern connected to said second circuit components are formed in and supported by said first layer, while a second part of said second printed pattern is formed in and supported by said second layer so that said first circuit components are bypassed by said second part of said second printed pattern, said second part of said second printed pattern extending underneath said first circuit components in said second layer, said second part of said second printed pattern bypassing said first components in a separate plane from a plane generally defined by said first components, wherein horizontal space required for said second printed pattern on said first layer is reduced;

first leads extending from said one or more read/write heads along one side of said actuator; and second leads extending from said servo head along another side of said actuator so that at least a portion of said second leads are positioned a selected distance in space from said first leads.

* * * * *

UNITED STATES PATENT AND TRADEMARK OFFICE
CERTIFICATE OF CORRECTION

PATENT NO. : 5,859,746
DATED : January 12, 1999
INVENTOR(S) : Ishida et al.

It is certified that error appears in the above-identified patent and that said Letters Patent is hereby corrected as shown below:

Column 8, line 2, after "45" delete "is"

Column 8, line 3, after "45" insert --is--

Column 10, line 53, delete "1" and insert --2-- therefor

Column 10, line 57, delete "1" and insert --2-- therefor

Column 10, line 60, delete "1" and insert --2-- therefor

Column 10, line 65, delete "1" and insert --2-- therefor

UNITED STATES PATENT AND TRADEMARK OFFICE
CERTIFICATE OF CORRECTION

PATENT NO. : 5,859,746
DATED : January 12, 1999
INVENTOR(S) : Ishida et al.

Page 2 of 2

It is certified that error appears in the above-identified patent and that said Letters Patent is hereby corrected as shown below:

Column 11, line 14, delete "1" and insert

--2-- therefor

Column 11, line 17, delete "1" and insert

--2-- therefor

Signed and Sealed this

Twenty-third Day of November, 1999

Attest:

Q. TODD DICKINSON

*Attesting Officer*   *Acting Commissioner of Patents and Trademarks*